United States Patent [19]

Kim

[11] Patent Number: 5,394,144
[45] Date of Patent: Feb. 28, 1995

[54] VARIABLE LENGTH CODE DECODING APPARATUS

[75] Inventor: Gyu-Seok Kim, Seoul, Rep. of Korea

[73] Assignee: Daewoo Electronics Co., Ltd., Seoul, Rep. of Korea

[21] Appl. No.: 73,745

[22] Filed: Jun. 8, 1993

[30] Foreign Application Priority Data

Jun. 9, 1992 [KR] Rep. of Korea .................. 1992-9946

[51] Int. Cl.⁶ ............................................. H03M 7/40
[52] U.S. Cl. ......................................... 341/67; 341/65; 341/106
[58] Field of Search ....................... 341/67, 106, 50, 65

[56] References Cited

U.S. PATENT DOCUMENTS 5,173,695 12/1992 Sun et al. ................................ 341/67

Primary Examiner—Sharon D. Logan
Attorney, Agent, or Firm—William F. Pinsak

[57] ABSTRACT

A variable length code (VLC) decoding apparatus disclosed herein has an interface circuit 10 wherein an input bit stream is fed. The interface circuit 10 includes a plurality of window registers for directly extracting the decoding objective bit stream from the input bit stream. Each of the window registers has $2^n$-bit storage locations for storing an bit stream shifted by 1 bit from that of its adjacent window registers. Therefore, the VLC decoding apparatus advantageously achieves a high speed for decoding operation through the use of a plurality of window registers for directly extracting a next undecoded sequence of an input bit stream.

2 Claims, 2 Drawing Sheets

VARIABLE LENGTH CODE DECODING APPARATUS

FIELD OF THE INVENTION

The present invention relates to a variable length code (VLC) decoding apparatus; and, more particularly, to an improved VLC decoding apparatus which is capable of providing a high speed decoding operation by effectively extracting a decoding objective bit stream.

DESCRIPTION OF THE PRIOR ART

Variable length coding is a technique often used for lossless data compression. This technique is used to convert fixed-length data to variable-length codewords based on the statistics of the data. The length of the codewords is chosen in such a manner that shorter codewords are used to represent more frequently occurring data and longer codewords are chosen to represent less frequently occurring data. By properly assigning the variable-length codewords to a library of all possible source codewords, the average word length of the variable-length codeword becomes shorter than that of the original data, thereby rendering it possible to achieve data compression.

In this connection, Huffman code design is a procedure commonly used to construct a minimum redundant variable length code for a known data statistic. In general, the encoding process can be implemented by a table-lookup process using an input data to address the table. The codewords and the word-length information are stored as table contents and outputted sequentially through the use of a buffer at a constant data rate onto the data channel.

At the receiving end, however, the decoding process is more complicated. Due to the variable length nature, each codeword has to be segmented from the received bit string before it can be decoded into a source symbol. Therefore, the design of a variable word length decoder is always more difficult than that of a variable length encoder.

There are several apparatus employed to decode a stream of variable length codewords. Among them, most often used is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves (which are also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

U.S. Pat. No, 5,032,838 issued on Jul. 15, 1991 to Masayoshi Murayama et al. discloses another prior art VLC decoding apparatus employing a table-lookup based technique, wherein a received bit stream is compared with the contents of a codeword table. The codeword table has an entry associated with each possible variable word-length codeword and contains information on the decoded fixed-length codewords and length of the variable length codewords. When the sequence of leading bits in an input register matches one of the entries in the codeword table, a codeword match is indicated. The input register is then shifted by the number of bits indicated by the word length entry, thereby making the next sequence of bits available for comparison with the entries in the codeword table. A sequential bit shifting operation is required to extract a next sequence of bits from the received bit stream. It is this time-consuming sequential bit shifting operation that has limited the use of this prior art decoder for a high-speed application.

A further table-lookup based VLC decoder is disclosed in an article by Ming-Ting Sun, et al., "High-Speed Programmable ICs for Decoding of Variable-Length Codes", Proc, SPIE 1153, Applications of Digital Image Processing XII, August, 1989. According to the VLC decoder disclosed in this article, the bit shifting operation at high speeds is reduced by using a barrel shifter and a decoding window shifting logic circuit which provides a decoding window that is directly shifted each time a word is detected. However, this process is still time consuming; and a complicated logic circuit is required in order to effect a shifting of the decoding window to a next undecoded sequence of input bits.

SUMMARY OF THE INVENTION

It is, therefore, a primary object of the invention to provide a VLC decoding apparatus which employs a plurality of window registers to directly extract a next undecoded sequence of an input bit stream available for the decoding process, thereby advantageously achieving a high speed decoding operation.

In accordance with the present invention, a VLC decoding apparatus is provided with an interface circuit for parallelly extracting a decoding objective bit stream from a $2^n$-bit input bit stream including a variable length code and a table-lookup memory connected to the interface circuit, for decoding the objective bit stream and for outputting decoded data including a decoded symbol and word length information the indicating the length of the decoded codeword corresponding to the decoded symbol. The interface circuit employed herein further comprises: a first latch circuit for receiving and holding said $2^n$-bit input bit stream; a second latch circuit for receiving and holding the $2^n$-bit input bit stream already held in the first latch circuit when a new $2^n$-bit input bit stream is fed to the first latch circuit; a plurality of window registers for receiving and holding the combined output from the first and the second latch circuits, each of the window registers having $2^n$-bit storage locations for storing a $2^n$-bit stream shifted by 1 bit from that of its adjacent window registers; and a control circuit responsive to the word length information for producing a window selection signal to select a window register holding a $2^n$-bit stream correctly shifted corresponding to the word length information to extract the objective bit stream.

BRIEF DESCRIPTION OF THE DRAWINGS

The above and other objects and features of the instant invention will become apparent from the following description of the preferred embodiments taken in conjunction with the accompanying drawings, in which.

DETAILED DESCRIPTION OF THE PREFERRED EMBODIMENTS

Figure 1:
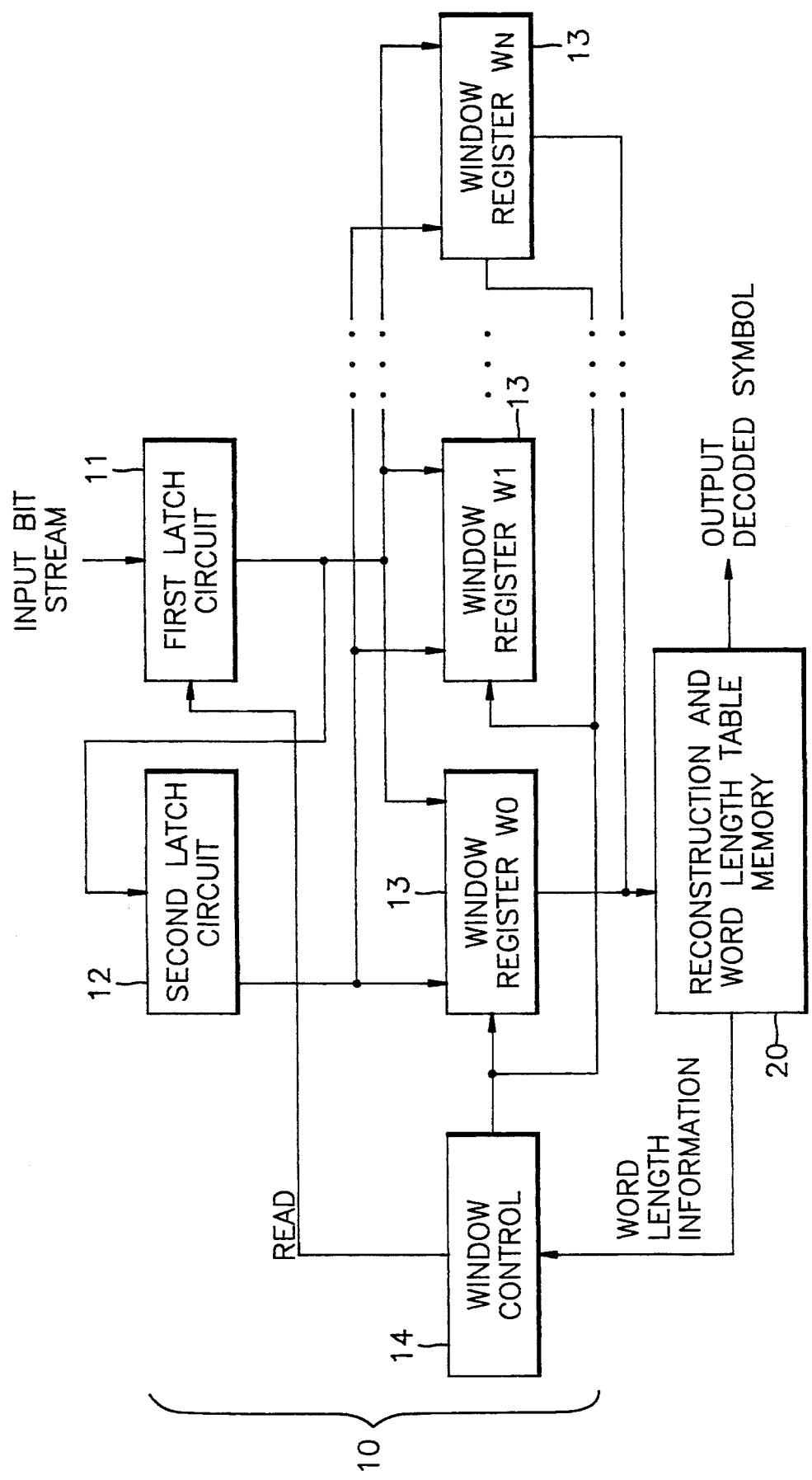
FIG. 1 shows a schematic diagram of a VLC decoding apparatus in accordance with the present invention.

A VLC decoder in accordance with the present invention is shown in FIG. 1. The VLC decoder comprises an interface circuit 10 and a reconstruction and word length table memory 20.

The interface circuit 10 is adapted to receive and hold an input bit stream and to parallelly extract a predetermined decoding objective bit stream, for example, a $2^n$-bit objective bit stream. As shown, the interface circuit 10 includes a first and a second latch circuits 11 and 12, a window circuit 13 and a control circuit 14.

The first latch circuit 11 is connected to an input channel and serves to sequentially receive and hold an input code bit stream in units of $2^n$-bit in response to a READ control signal from the control circuit 14 (where n is a positive integer). The second latch circuit 12 functions to receive and hold the $2^n$-bit input bit stream previously held in the first latch circuit 11.

The window circuit 13 includes a plurality of window registers, $W_0$, $W_1$, ... and $W_N$, which are commonly connected to the first and the second latch circuits 11 and 12. As shown in FIG. 1, each of the window register has a plurality of bit storage locations for storing a $2^n$-bit stream which is shifted by 1 bit from that stored in its adjacent window register. Therefore, assuming that an input bit stream stored in the first latch circuit 11 is L1(n−1),L(n−2), ..., L1(0) and a previous input bit stream stored in the second latch circuit 12 is, L2(n−1), L2(n−2), ..., L2(0), the window register $W_0$ stores said bit stream, L2(n−1),L2(n−2), ..., L2(0), as a decoding objective bit stream; and the window register $W_1$ may holds an bit strean L2(n−2), ..., L2(0), L1(n−1). In the same manner, the window register $W_N$ hold an bit stream, L1(n−1), ..., L1(1), L1(0).

The control circuit 14 receives a word length data output from the reconstruction and word length table memory 20 and generates a READ signal and a window selection signal. The window selection signal is used to select the output of window registers, $W_0$, $W_1$, ..., and $W_N$. Therefore, it may be readily appreciated that one output from window registers, $W_0$, $W_1$, ..., and $W_N$, is extracted as a decoding objective bit stream. As is known in the art, the control circuit 14 may be readily implemented through the use of an adder and a code conversion circuit (not shown ), wherein the adder functions to add present word length information to previous word length information and to generate total word length information of the decoded codeword, while the code conversion circuit is adapted to receive the total word length information and to produce the READ signal and the window selection signal.

The reconstruction and word length table memory 20, as disclosed in the afore-mentioned article by Ming-Ting Sun, et al., may be advantageously implemented in Programmable Logic Arrays (PLAs). The PLA-based reconstruction and word length table memory may have a reconstructed symbols table and a word length information table. Each table normally consists of two portions, the "AND" plane corresponding to the codewords and the "OR" plane corresponding to the desired table contents. These tables are addressed by matching an entry in the "AND" plane with an input bit stream. Conceptually, each codeword can be represented as an entry in the "AND" plane according to the bit pattern of the codeword. When the input bit stream matches an entry in the "AND" plane, the entry in "OR" plane corresponding to the decoded symbol and the entry corresponding to the word length of the decoded symbol becomes activated.

To illustrate the operation of the decoder, a sample VLC with six entry is shown in Table 1.

TABLE 1

| symbol | word length | codeword |
|---|---|---|
| a | 2 | 00 |
| b | 2 | 01 |
| c | 3 | 100 |
| d | 3 | 101 |
| e | 3 | 110 |
| f | 4 | 1110 |
| g | 5 | 11110 |
| h | 5 | 11111 |

As may be seen from Table 1, the length of the codewords is chosen such that shorter codewords be used to represent more frequently occurring symbols and longer codewords be used to represent less frequently occurring symbols on the basis of the statistics of the symbol.

Figure 2:
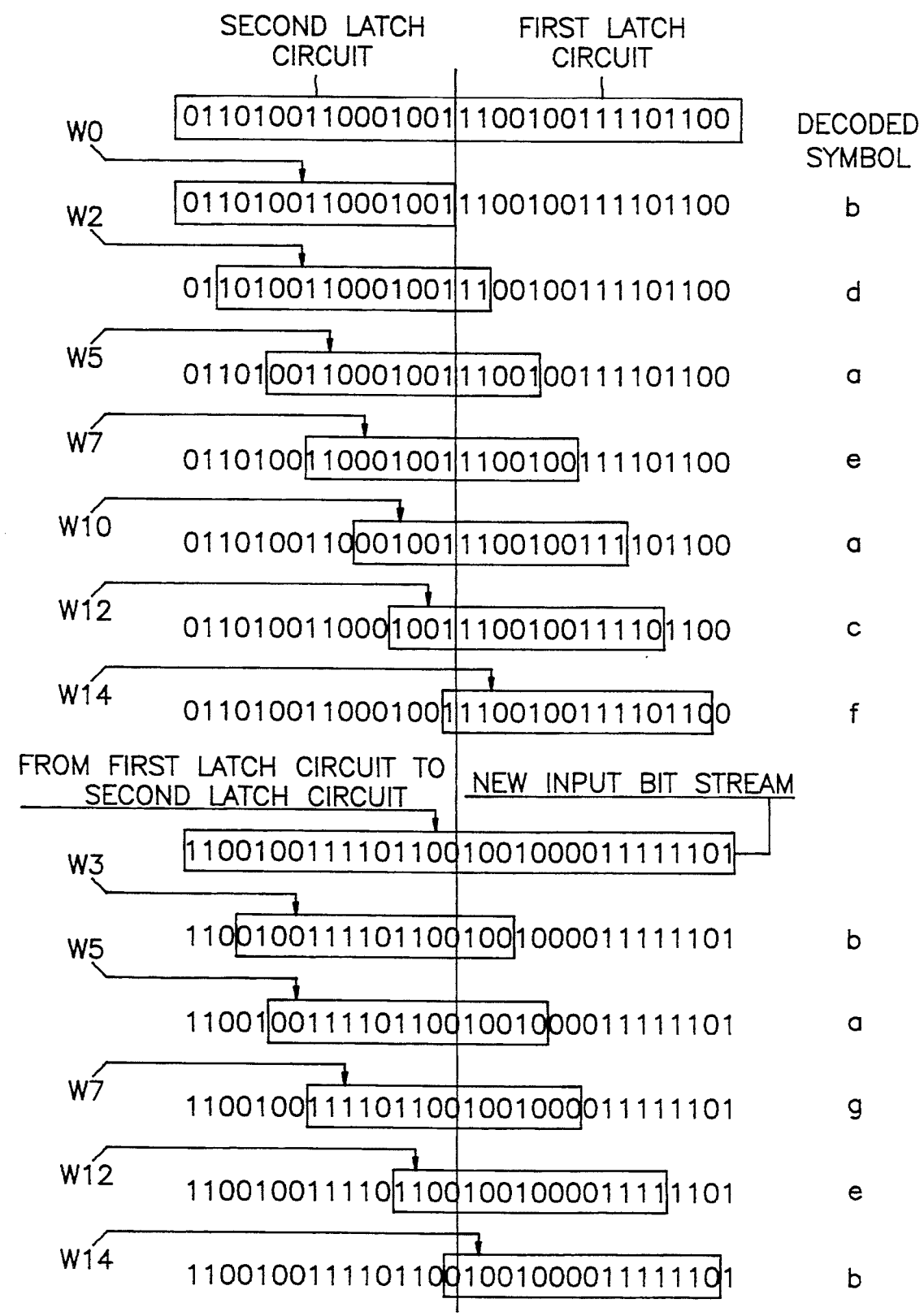
FIG. 2 provides an explanatory diagram for illustrating the extracting operation of the VLC decoding apparatus shown in FIG. 1.

Referring to FIG. 2, in the beginning of the operation, a 16-bit input bit stream of "0110100110001001" is latched to the first latch circuit 11. When the READ signal is raised, the content of the latch circuit 11 is transferred into the second latch circuit 12; and another 16-bit input bit stream of "1100100111101100" is simultaneously latched into the first latch circuit 11. Thus, 32 bits of the bit stream are now available for the decoding process. The window circuit 13 serves to extract the correctly shifted decoding objective bit stream from a combined output of the first and the second latch circuits 11 and 12. Therefore, a next codeword to be decoded always starts from the leading bit of the output from a selected window register.

As shown in FIG. 2, each of the window registers has 16 bit storage locations to store a 16-bit stream shifted by 1 bit from that held in its adjacent window register. As described above, a 16-bit input bit stream latched in the first latch circuit 11 is of "1100100111101100" and another 16-bit input bit stream held in the second latch circuit 12 is of "0110100110001001". Therefore, when the window register $W_0$ is selected by the window control circuit 14, the interface circuit 10 extracts and provides the bit stream "0110100110001001" to the reconstruction and word length table memory 20 in which only the leading 2 bits of "01" are decoded into a decoded symbol of "b" and word length information representative of "2" is produced. The word length information is then coupled to the control circuit 14. The control circuit 14 is responsive to the word length information and provides a window selection signal for selecting the window register $W_2$. As shown in FIG. 2, the bit stream of "1010011000100111" held in the window register $W_2$ is directly selected as a next decoding objective bit stream. The bit stream of "1010011000100111" is coupled to the reconstruction and word length table memory 20 in which the leading 3 bits of "101" are decoded into a decoded symbol of "d". The reconstruction and word length table memory 20 provides word length information representative of "3" to the control circuit 14. The control circuit 14 is responsive to the word length information and provides a window selection signal for selecting the window register W$_5$. In this manner, the decoding process is repeated until the bit stream held in the second latch circuit 12 is all decoded. Thereafter, the bit stream held in the second latch is all decoded, the READ signal is raised and the content of the first latch circuit 11 is then transferred to the second latch circuit 12. At the same time, a new 16-bit input bit stream of "1001000011111101" is read into the first latch circuit 11 and the decoding process continues until all bit streams are decoded. From the foregoing, it is clear that the shifting operation for extracting a next undecoded sequence of input bit streams is carried out through the use of a plurality of window registers which are directly selected by the control circuit, thereby advantageously achieving the high speed decoding operation.

While the present invention has been shown and described in connection with the preferred embodiments thereof, it will be readily apparent to those of ordinary skill in the art that many changes and modifications may be made without departing from the spirit and scope of the invention as defined in the appended claims.

What is claimed is:

1. A variable length code decoding apparatus having an interface means for parallelly extracting an objective bit stream from input bit streams which includes variable length codewords and a table-lookup memory means, which is connected to the interface means, for decoding the objective bit stream and outputting a decoded symbol and word length information which indicates the length of decoded codeword corresponding to the decoded symbol, wherein said interface means comprises:

a first latch means for receiving and holding a first $2^n$-bit input bit stream;

a second latch means for receiving and holding the first $2^n$-bit input bit stream held in the first latch means when a second $2^n$-bit input bit stream is fed to the first latch means;

a plurality of window registers, hardwiredly coupled to the first and the second latch means and the table-lookup memory means, for receiving and holding the first and the second $2^n$-bit input bit streams outputted from the first and the second latch means, each of the window registers having $2^n$-bit storage locations for storing a $2^n$-bit bit stream shifted by 1 bit from that stored in adjacent window register; and a control means responsive to word length information outputted from the table-lookup memory means for producing a window selection signal to directly select a window register holding a $2^n$-bit stream correctly shifted according to the word length information so as to extract the objective bit stream.

2. The variable length code decoding apparatus of claim 1, wherein said control means is coupled to the first latch means and produces a READ signal for latching the second $2^n$-bit input bit stream into the first latch means when the first $2^n$-bit input bit stream held in the second latch means has been decoded.

* * * * *